(12) United States Patent
Nozawa et al.

(10) Patent No.: US 8,785,809 B2
(45) Date of Patent: Jul. 22, 2014

(54) PROCESSING DEVICE

(75) Inventors: Toshihisa Nozawa, Amagasaki (JP); Tamaki Yuasa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 13/453,621

(22) Filed: Apr. 23, 2012

(65) Prior Publication Data
US 2012/0204983 A1 Aug. 16, 2012

Related U.S. Application Data

(63) Continuation of application No. 12/161,591, filed as application No. PCT/JP2007/054189 on Mar. 5, 2007, now Pat. No. 8,173,928.

(30) Foreign Application Priority Data

Mar. 6, 2006 (JP) .................................. 2006-059078

(51) Int. Cl.
*B23K 10/00* (2006.01)
(52) U.S. Cl.
USPC ............ 219/121.54; 219/121.43; 219/121.58; 156/345.29; 156/345.51
(58) Field of Classification Search
CPC ............. H05H 1/36; H05H 1/46; B23K 10/00
USPC ............... 219/121.4, 121.43, 121.51, 121.58; 315/111.51; 156/345.41, 345.48, 156/345.51, 345.34, 345.29
See application file for complete search history.

(56) References Cited

U.S. PATENT DOCUMENTS

| 4,840,350 | A | | 6/1989 | Cook |
| 6,028,285 | A | * | 2/2000 | Khater et al. ............ 219/121.43 |
| 6,214,161 | B1 | * | 4/2001 | Becker et al. ............ 156/345.48 |
| 6,379,575 | B1 | * | 4/2002 | Yin et al. .......................... 216/67 |
| 7,303,998 | B2 | * | 12/2007 | Aramaki et al. ............... 438/715 |
| 2002/0134509 | A1 | * | 9/2002 | Ohkuni ..................... 156/345.48 |
| 2004/0182440 | A1 | | 9/2004 | Watts et al. |

FOREIGN PATENT DOCUMENTS

| JP | 8-74041 | 3/1996 |
| JP | 08-074071 | 3/1996 |
| JP | 2000-79336 | 3/2000 |
| JP | 2001-131751 | 5/2001 |
| JP | 2001-313289 | 11/2001 |
| JP | 2003-161281 | 6/2003 |
| JP | 2003-229417 | 8/2003 |

OTHER PUBLICATIONS

Office Action (with English translation) issued on Nov. 15, 2011, in corresponding Japanese Appln. No. 2006-059078 (5 pages).

* cited by examiner

*Primary Examiner* — Mark Paschall
(74) *Attorney, Agent, or Firm* — Rothwell, Figg, Ernst & Manbeck, P.C.

(57) ABSTRACT

A processing apparatus for performing a specified process on a target object at a predetermined process pressure, the apparatus having an evacuable processing chamber having a gas exhaust port formed in a bottom portion thereof, a mounting table provided within the processing chamber for holding the target object, a pressure control valve connected to the gas exhaust port, the pressure control valve including a slide-type valve body for changing an area of an opening region of a valve port, and a gas exhaust system connected to the pressure control valve. The pressure control valve is arranged such that a center axis of the mounting table lies within an opening region of the pressure control valve formed over a practical use region of a valve opening degree of the pressure control valve.

20 Claims, 10 Drawing Sheets

PROCESSING DEVICE

CROSS-REFERENCE(S) TO RELATED APPLICATIONS

This application is a continuation application of U.S. application Ser. No. 12/161,591, filed Jul. 21, 2008, which is the national stage of PCT/JP07/054,189 filed Mar. 5, 2007, and which claims priority to JP 2006-059078 filed Mar. 6, 2006. The entire content of U.S. application Ser. No. 12/161,591 is incorporated herein by reference.

FIELD OF THE INVENTION

The present invention relates to a single wafer plasma processing apparatus for use in performing various kinds of processes, such as plasma processing, film-forming and etching, on semiconductor wafers or the like sheet by sheet.

BACKGROUND OF THE INVENTION

In order to manufacture semiconductor products such as a semiconductor integrated circuit and the like, it is general that a semiconductor wafer is repeatedly subjected to various kinds of processes, including film-forming, etching, oxidizing and diffusing, ashing and reforming. As the semiconductor products become highly dense and miniaturized, the various kinds of processes need to be performed with high in-plane uniformity in view of the improvement of a product yield rate.

In this regard, a plasma processing apparatus will be described as an example of the conventional single wafer plasma processing apparatus. Plasma processing apparatuses are disclosed in, e.g., Japanese Patent Laid-open Publication Nos. H3-191073, H5-343334, H9-181052 and 2002-311892. FIG. 11 is a schematic configuration view showing a conventional plasma processing apparatus.

Referring to FIG. 11, the plasma processing apparatus 2 includes an evacuable processing chamber 4 and a mounting table 6, provided within the processing chamber 4, for mounting a semiconductor wafer W thereon. The mounting table 6 is supported by an "L"-like support arm 7 extending from a sidewall of the processing chamber 4. A disk-like ceiling plate 8 that transmits microwaves is air-tightly provided in a ceiling portion of the processing chamber 4 in a facing relationship with the mounting table 6. The ceiling plate 8 is made of aluminum nitride, quartz or the like. A gas nozzle 9 for introducing a specified gas into the processing chamber 4 is formed in the sidewall of the processing chamber 4.

On an upper surface of the ceiling plate 8, there are installed a disk-like planar antenna member 10 having a thickness of about several millimeters and a retardation member 12 for shortening the wavelength of microwaves in a radial direction of the planar antenna member 10. The retardation member 12 is made of, e.g., a dielectric material. A plurality of microwave irradiation holes, e.g., elongated through-holes, is formed in the planar antenna member 10. The microwave irradiation holes 14 are usually arranged in a concentric pattern or a spiral pattern. A central conductor 18 of a coaxial waveguide tube 16 is connected to a central portion of the planar antenna member 10 so that the microwaves of, e.g., 2.45 GHz, generated in a microwave generator 20 is converted to a specified vibration mode by means of a mode transducer 22 and then sent to the planar antenna member 31. While propagating radially of the planar antenna member 10, the microwaves are irradiated through the microwave irradiation holes 14 formed in the planar antenna member 1. Then, the microwaves are transmitted through the ceiling plate 8 and introduced into the processing chamber 4, whereby the microwaves generate plasma in a processing space S within the processing chamber 4.

A gas exhaust port 24 is formed in a central region of a bottom portion 4A of the processing chamber 4. A pressure control valve 26 is attached to the gas exhaust port 24. The pressure within the processing chamber 4 is regulated by controlling the opening degree of the pressure control valve 26 and consequently changing the area of an aperture of a valve port 28. The pressure control valve 26 is of, e.g., a gate valve. The opening degree, i.e., the aperture area, of the pressure control valve 26 is controlled by slidingly moving a valve body 30 in the direction indicated by arrow 31, e.g., in a horizontal direction. A turbo molecular pump 32 as a vacuum pump of a gas exhaust system is connected to a gas outlet side of the pressure control valve 26 so that it can evacuate the processing chamber 4 into a vacuum state. With this configuration, plasma is generated in the processing space S within the processing chamber 4 and a semiconductor wafer W is subjected to plasma processes such as plasma etching, plasma film-forming and the like.

In order to increase the yield rate of products as mentioned above, the plasma processes need to be uniformly performed over a wafer plane. In a general single wafer processing apparatus as well as the plasma processing apparatus noted above, the processing uniformity is heavily affected by a way of causing a gas to flow within the processing space S. To that end, the gas exhaust port 24 and the valve port 28 of the pressure control valve 26 are arranged in the central region of the bottom portion 4A of the processing chamber 4 while, for example, a center axis of the mounting table 6 is in alignment with the center axis of the gas exhaust port 24 and the valve port 28. In this way, the ambient gas within the processing space S is allowed to uniformly flow around the mounting table 6 and then flow down toward the gas exhaust port 24 positioned below the mounting table 6.

With the arrangement of the pressure control valve 26 as set forth above, if the valve opening degree is equal to 100%, the ambient gas within the processing space S flows down in a state that it is uniformly distributed around the mounting table 6. However, if the valve opening degree is small as is the case in an actual process, there occurs a deviation in the gas flow. In other words, when the afore-mentioned pressure control valve 26 is used for the purpose of pressure control, it is necessary to regulate the target control pressure as the process pressure with a good controllability with respect to a pressure range around the target control pressure. To this end, it is general that the range of the valve opening degree practically used in the process is set equal to about 5 to 40%. The practical use range of the valve opening degree noted above is also recommended by control valve makers as a desirable use range.

Stating differently, if the processing apparatus is designed to control the process pressure with an excessively small valve opening degree or an excessively high valve opening degree, the change in gas exhaust conductance relative to the change in the valve opening degree is too small or too great to stably control the pressure. In view of this, the processing apparatus available in practice is as a whole designed to ensure that the pressure range around the target control pressure can be stably controlled in a process by using the pressure control valve 26 at a valve opening degree of about 20%.

However, in case the valve opening degree of the pressure control valve 26 is as small as 20%, the valve port 28 is mostly closed by the valve body 30 as illustrated in FIG. 12, which is a plan view of the valve port 28. The opening region M (the hatched region in FIG. 12) through which a gas actually passes has a shape of crescent. Therefore, the opening region M is positioned far away from the center axis 6A of the mounting table 6.

This creates a deviation in the flow rate of a gas flowing down around the mounting table 6 as indicated by an arrow 34 in FIG. 11. As a consequence, it becomes impossible to uniformly exhaust the gas from around the mounting table 6. This poses a problem in that the in-plane uniformity is reduced when processing a wafer. This problem becomes conspicuous as the size of a gas exhaust port grows larger together with the increase in the wafer size to 300 mm and the resultant increase in the size of the processing chamber 4.

SUMMARY OF THE INVENTION

In view of the problems mentioned above and for the purpose of effectively solving the problems, it is an object of the present invention to provide a processing apparatus capable of exhausting an ambient gas in a processing space in a state that the ambient gas is uniformly distributed around a mounting table when a valve opening degree varies within a practical use region. This comes true by arranging a pressure control valve in a gas exhaust port eccentrically from a center axis of the mounting table.

In accordance with an aspect of the present invention, there is provided a processing apparatus for performing a specified process on a target object at a predetermined process pressure, the apparatus including: an evacuable processing chamber having a gas exhaust port formed in a bottom portion thereof; a mounting table provided within the processing chamber for holding the target object; a pressure control valve connected to the gas exhaust port, the pressure control valve including a slide-type valve body for changing an area of an opening region of a valve port; and a gas exhaust system connected to the pressure control valve, wherein the pressure control valve is eccentrically arranged such that a center axis of the mounting table lies within an opening region of the pressure control valve formed over a practical use region of a valve opening degree of the pressure control valve.

In this way, the pressure control valve is eccentrically provided such that the center axis of the mounting table lies within the opening region formed over the practical use region of the valve opening degree of the pressure control valve. By arranging the pressure control valve in the gas exhaust port eccentrically from the center axis of the mounting table, it is possible to exhaust the ambient gas in the processing space in a uniformly distributed state around the mounting table when the pressure control valve is used in the practical use region of the valve opening degree. This makes it possible to process the target with increased in-plane uniformity.

In this case, for example, the gas exhaust port is formed eccentrically relative to the center axis of the mounting table.

Further, for example, the practical use region of the valve opening degree is in a range of 5 to 40%.

Furthermore, for example, the center axis of the mounting table is positioned on a movement trajectory of a gravity center of a plane defined by the opening region.

In addition, for example, the gas exhaust system includes a turbo molecular pump connected to the pressure control valve.

Moreover, for example, the valve body is rectilinearly slidable.

Further, for example, the valve body is curvilinearly and swingably slidable.

Furthermore, for example, the mounting table is supported by a sidewall of the processing chamber through a support arm.

In addition, for example, the mounting table is supported on the bottom portion of the processing chamber through support legs.

The processing apparatus in accordance with the present invention provides the advantageous effects as follows.

The pressure control valve is eccentrically provided such that the center axis of the mounting table lies within the opening region formed over the practical use region of the valve opening degree of the pressure control valve. By arranging the pressure control valve in the gas exhaust port eccentrically from the center axis of the mounting table, it is possible to exhaust the ambient gas in the processing space in a uniformly distributed state around the mounting table when the pressure control valve is used in the practical use region of the valve opening degree. This makes it possible to process the target object with increased in-plane uniformity.

DETAILED DESCRIPTION OF THE PREFERRED EMBODIMENTS

Hereinafter, one embodiment of a processing apparatus in accordance with the present invention will be described with reference to the accompanying drawings.

Figure 1:
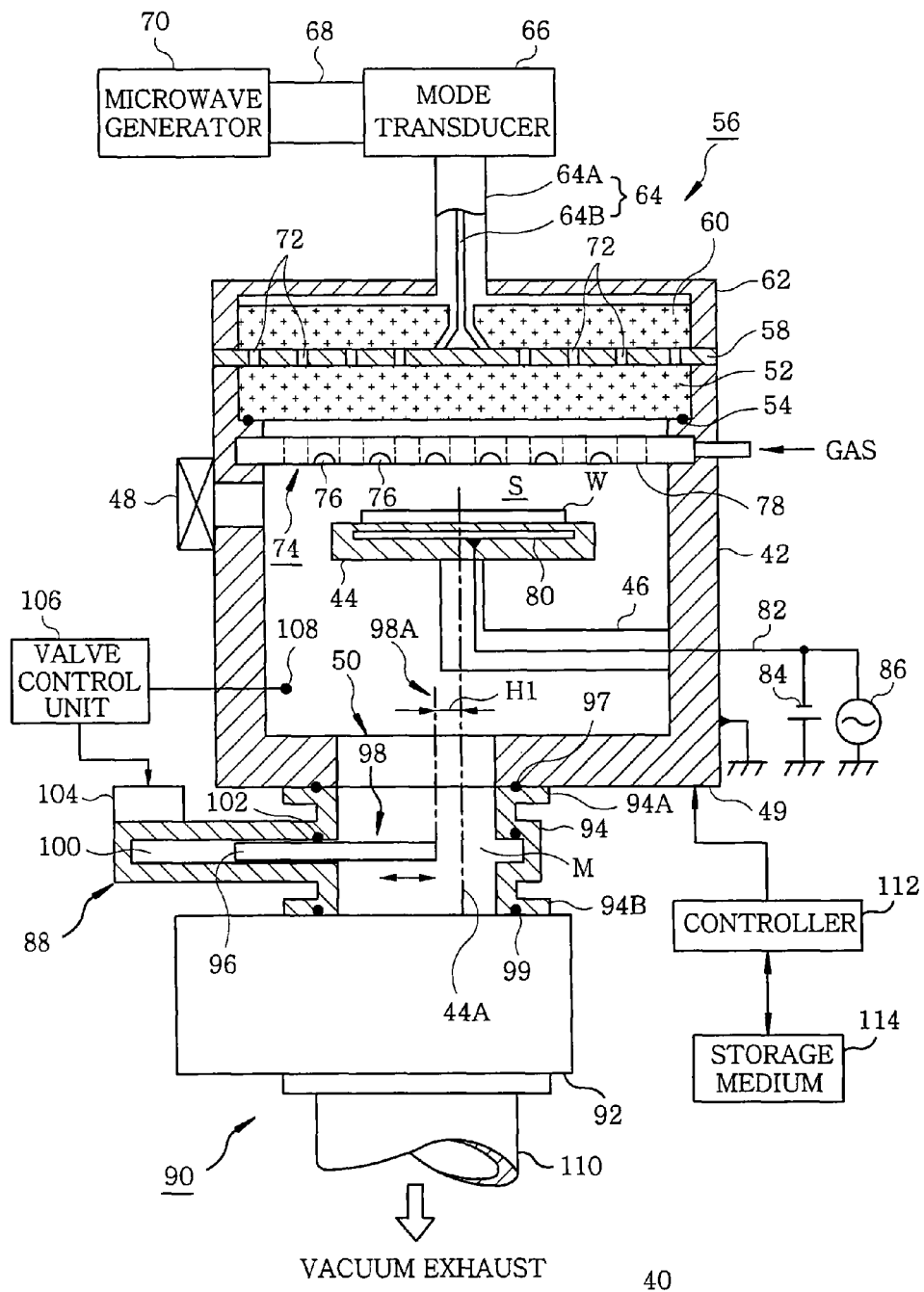
FIG. 1 is a configuration view showing one example of a processing apparatus in accordance with the present invention.
Figure 2A:
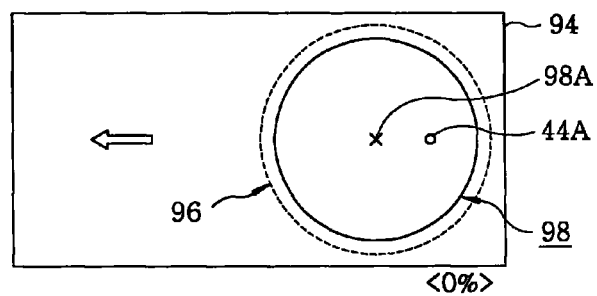
FIGS. 2A to 2D are views explaining the change in a valve opening degree of a pressure control valve.
Figure 2B:
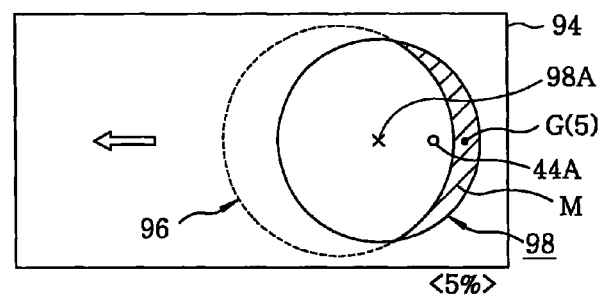
Figure 2C:
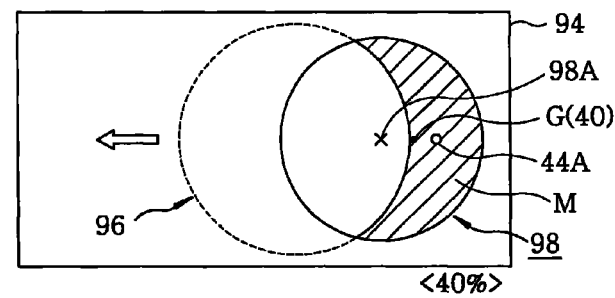
Figure 2D:
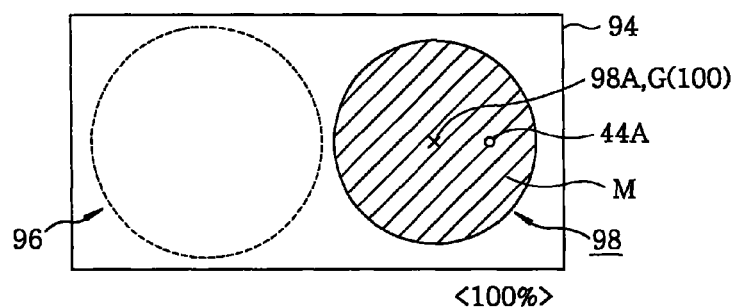
Figure 3:
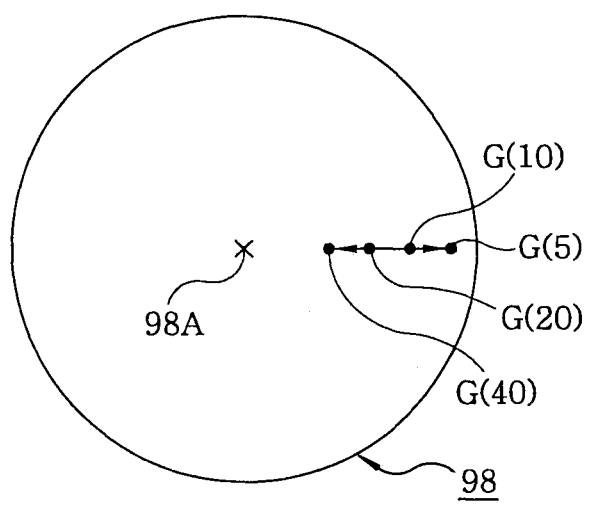
FIG. 3 is a plan view illustrating one example of the movement trajectory of a gravity center of the plane defined by an opening region.
Figure 4:
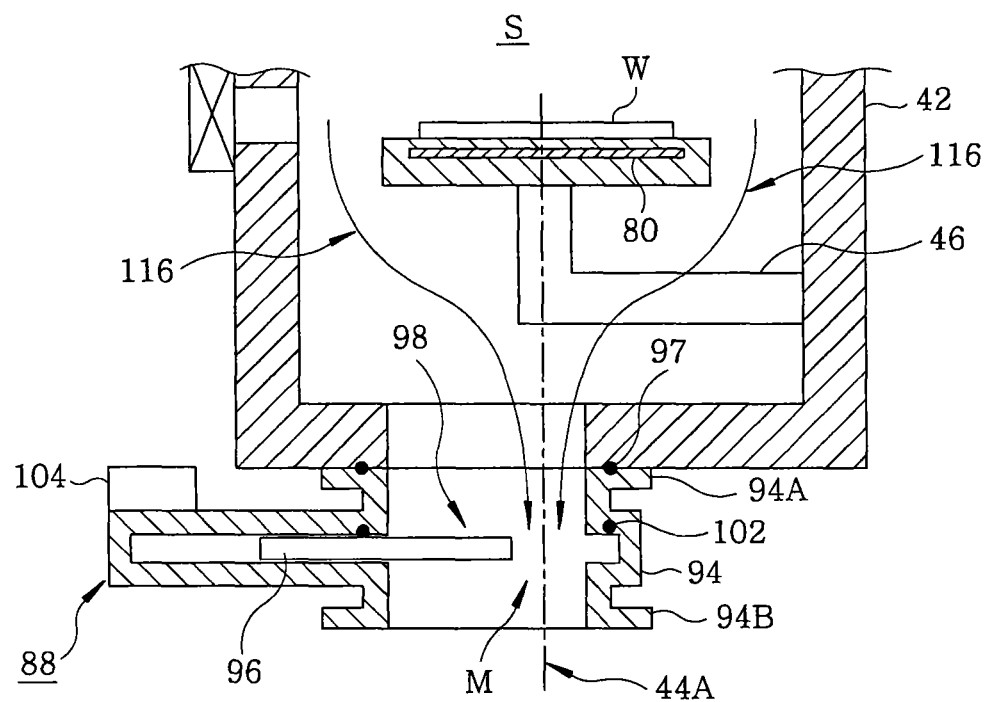
FIG. 4 is a schematic view illustrating the flow of an exhaust gas in the processing apparatus of the present invention.
Figure 5A:
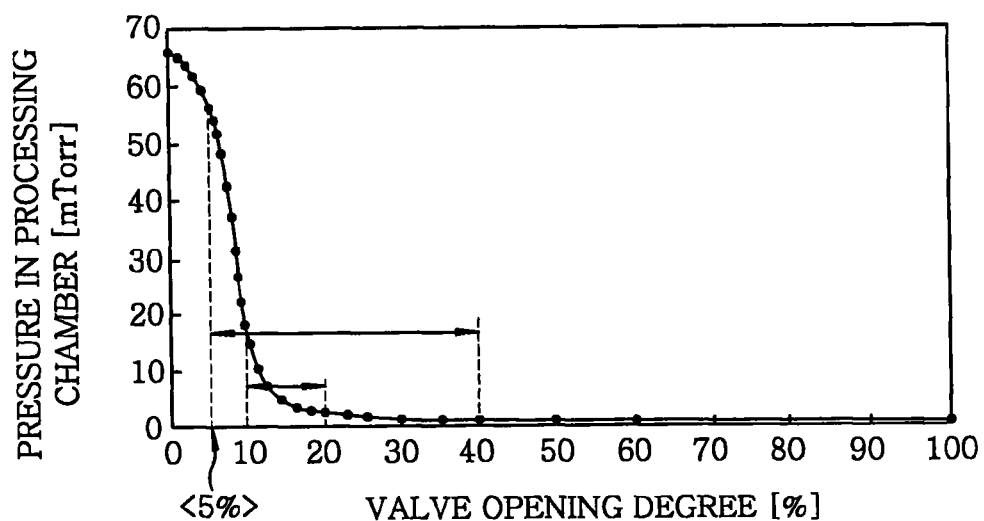
FIGS. 5A and 5B are graphs representing the relationship between a valve opening degree of a pressure control valve and a pressure within a processing chamber and the relationship between a valve opening degree of a pressure control valve and an exhaust conductance.
Figure 5B:
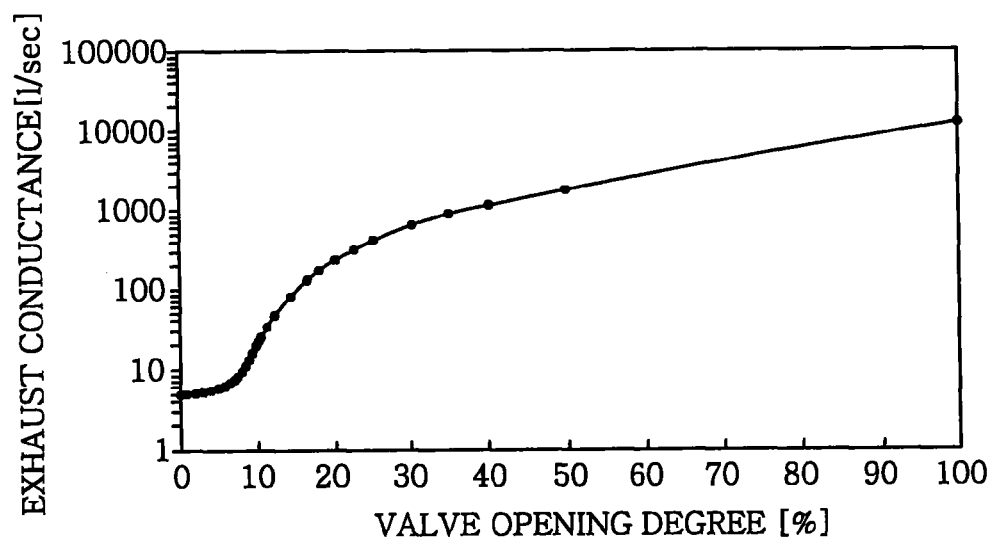

FIG. 1 is a configuration view showing one example of a processing apparatus in accordance with the present invention. FIGS. 2A to 2D are views explaining the change in a valve opening degree of a pressure control valve. FIG. 3 is a plan view illustrating one example of the movement trajectory of a gravity center of the plane defined by an opening region. FIG. 4 is a schematic view illustrating the flow of an exhaust gas in the processing apparatus of the present invention. FIGS. 5A and 5B are graphs representing the relationship between the valve opening degree of the pressure control valve and a pressure within a processing chamber and the relationship between the valve opening degree of the pressure control valve and an exhaust conductance. A plasma processing apparatus will be described herein as an example of the processing apparatus.

As shown in the drawings, a plasma processing apparatus 40 as one example of the processing apparatus includes a processing chamber 42 formed into a tubular shape as a whole. The processing chamber 42 has a sidewall and a bottom wall, both of which are made of a conducting material such as aluminum or the like. A hermetically sealed processing space S is formed within the processing chamber 42 so that plasma can be generated in the processing space S. The processing chamber 42 is electrically grounded.

In the processing chamber 42, there is disposed a mounting table 44 for mounting, e.g., a semiconductor wafer W as a target object to be processed on its upper surface. The mounting table 44 is formed into a generally disk-like flat shape and is made of, e.g., alumite-treated aluminum. The mounting table 44 is supported by the sidewall of the processing chamber 42 through an "L"-like curved support arm 46 made of, e.g., aluminum or the like.

A gate valve 48 is provided in the sidewall of the processing chamber 42 and it is opened and closed when the semiconductor wafer W is loaded into and unloaded out of the processing chamber 42. A gas exhaust port 50 through which an ambient gas in the processing chamber 42 is exhausted is formed in a bottom portion 49 of the processing chamber 42.

The processing chamber 42 is opened at its ceiling portion. A microwave-transmitting ceiling plate 52 made of a ceramic material, e.g., Al$_2$O$_3$, or quartz is air-tightly installed in the ceiling portion of the processing chamber 42 through a seal member 54 such as an O-ring or the like. Taking a pressure resistance into account, the ceiling plate 52 is formed to have a thickness of, e.g., about 20 mm.

On an upper surface of the ceiling plate 52, there is provided a plasma generating unit 56 for generating plasma within the processing chamber 42. Specifically, the plasma generating unit 56 includes a disk-like planar antenna member 58 provided on the upper surface of the ceiling plate 52. A retardation member 60 is arranged on the planar antenna member 58. The retardation member 60 has a high dielectric constant so that it can shorten the wavelength of microwaves. The planar antenna member 58 serves as a bottom plate of a waveguide box 62 which is an electrically-conductive hollow cylindrical container that covers the upper portion of the retardation member 60. The planar antenna member 58 is provided in a facing relationship with the mounting table 44 in the processing chamber 42.

The peripheral portions of the waveguide box 62 and the planar antenna member 58 are all kept in electric conduction with the processing chamber 42. An outer tube 64A of a coaxial waveguide tube 64 is connected to a central upper portion of the waveguide box 62. An inner conductor 61B of the coaxial waveguide tube 64 is connected to a central region of the planar antenna member 58 through a central through-hole of the retardation member 60. The coaxial waveguide tube 64 is connected to a microwave generator 70 having an output power of, e.g., 2.45 GHz, via a mode transducer 66, a waveguide tube 68 and a matching box (not shown) with a matching function, so that the coaxial waveguide tube 64 can propagate microwaves to the planar antenna member 58.

The planar antenna member 58 is formed of, e.g., a copper plate or an aluminum plate whose surface is plated with silver. A multiplicity of microwave irradiation holes 72 each having the shape of, e.g., an elongated through-hole, is formed in the planar antenna member 58. The microwave irradiation holes 72 are not particularly limited in their arrangement pattern but may be arranged, e.g., in a concentric circle pattern, a spiral pattern or a radial pattern.

Further, provided above the mounting table 44 is a gas supply unit 74 for supplying a processing gas required in performing a process within the processing chamber 42. Specifically, the gas supply unit 74 includes a shower head portion 78 made of, e.g., quartz in which gas a flow path is formed in a lattice pattern. A multiplicity of gas injection holes 76 are formed along the gas flow path.

The mounting table 44 is provided with a plurality of, e.g., three, elevator pins for raising and lowering the semiconductor wafer W during the course of loading and unloading the same. The whole part of the mounting table 44 is made of a heat-resistant material, e.g., a ceramic material such as alumina or the like.

A thin electrostatic chuck 80 having a conductor wire arranged, e.g., in a net-like pattern, is provided on the upper surface side of the mounting table 44. The wafer W placed on the mounting table 44, particularly on the electrostatic chuck 80 is attracted and held in place by an electrostatic attraction force. The conductor wire of the electrostatic chuck 80 is connected to a direct current power source 84 via a wiring line 82 so that the electrostatic chuck 80 can generate the electrostatic attraction force. The wiring line 82 is also connected to a radio frequency (RF) bias power supply 86 for applying a RF bias power of, e.g., 13.56 MHz, to the conductor wire of the electrostatic chuck 80.

The gas exhaust port 50 provided in the bottom portion 49 of the processing chamber 42 has a circular shape and is formed eccentrically from a center axis 44A vertically extending through the center of the mounting table 44. A pressure control valve 88 for controlling the pressure in the processing chamber 42 is directly connected at its gas inlet end to the gas exhaust port 50. A vacuum pump 92 constituting a gas exhaust system 90 is directly connected to a gas outlet end of the pressure control valve 88.

More specifically, in case the processing chamber 42 has a size capable of processing a wafer W of 300 mm in size, the diameter of the gas exhaust port 50 is set equal to, e.g., about 200 to 350 mm. The pressure control valve 88 connected to the gas exhaust port 50 is formed of, e.g., a gate valve, and includes a casing 94 of, e.g., a short cylindrical shape, and a slidingly movable disk-like valve body 96 received within the casing 94. The casing 94 has a gas inlet side flange 94A air-tightly jointed to the gas exhaust port 50 through a seal member 97, such as an O-ring or the like, by means of bolts (not shown). The casing 94 is also provided with a gas outlet side flange 94B air-tightly jointed to the vacuum pump 92 through a seal member 99, such as an O-ring or the like, by means of bolts (not shown).

A circular valve port 98 is formed within the casing 94 in the same size as that of the gas exhaust port 50. The valve body 96 is slidingly movable relative to the valve port 98 in a direction perpendicular to the flow direction of an exhaust gas. A valve body receiving space 100 is formed in one side of the casing 94 so that the valve body 96 can be retracted from the valve port 98.

A seal member 102 formed of an O-ring or the like is provided in a wall that defines a peripheral portion of the valve port 98. When the pressure control valve 88 is fully closed, the seal member 102 makes contact with the valve body 96 so that the valve port 98 can be closed in a completely air-tight state. An actuator 104 is provided on one side of the casing 94. The actuator 104 is connected to the valve body 96 by an operating rod (not shown) so that the valve body 96 can be made to rectilinearly slide. The actuator 104 is controlled by a valve control unit 106 including, e.g., a computer. The valve control unit 106 is designed to control the valve opening degree of the pressure control valve 88, based on the detection values of a pressure detector 108 arranged within the processing chamber 42. FIGS. 2A to 2D schematically depict the change of the valve opening degree from 0% to 100%. Specifically, FIG. 2A shows a valve opening degree of 0% (a fully closed state), FIG. 2B shows a valve opening degree of 5%, FIG. 2C shows a valve opening degree of 40%, and FIG. 2D shows a valve opening degree of 100% (a fully opened state).

Figure 12:
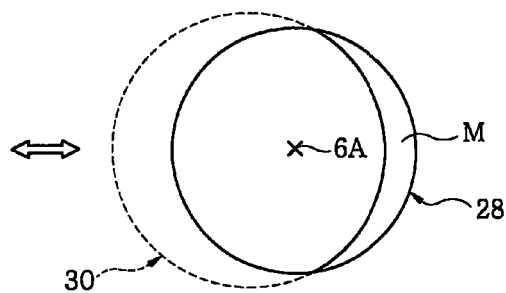
FIG. 12 is a plan view illustrating a state that the valve opening degree of a pressure control valve is about 20% in the conventional processing apparatus.

In this regard, it is a feature of the present invention that the pressure control valve 88 is eccentrically arranged to place the center axis 44A of the mounting table 44 within an opening region M formed by a practical use region of the valve opening degree of the pressure control valve 88. The term "opening region M" used herein refers to the region of the valve port 98 through which the exhaust gas flows actually (see FIG. 12). A plan view of the valve port 98 is shown in FIGS. 2A to 2D in which the opening region M is indicated by hatching. Therefore, the area of the opening region M varies with the valve opening degree.

As mentioned earlier, the practical use region of the valve opening degree refers to a valve opening degree extent over which the target control pressure, i.e., the process pressure can be regulated with a good controllability in a pressure range around the target control pressure when the pressure control valve 88 is used in controlling the pressure in the processing chamber 42. In general, the practical use range of the valve opening degree is recommended by control valve makers as a desirable use range. In the illustrated embodiment, the practical use region of the valve opening degree is in the range of, e.g., 5 to 40%. When processing a wafer, the pressure control valve 88 is used within the extent between the opening region M shown in FIG. 2B wherein the valve opening degree is 5% and the opening region M shown in FIG. 2C wherein the valve opening degree is 40%. For this reason, the pressure control valve 88 is attached in an offset state so that the center axis 44A of the mounting table 44 can lie within the opening region M shown in FIG. 2C wherein the valve opening degree is 40%.

Referring to FIG. 1, the offset amount (eccentricity amount) is defined by the distance H1 between the center axis 98A of the valve port 98 (which coincides with the center axis of the gas exhaust port 50) and the center axis 44A of the mounting table 44.

Turning to FIGS. 2A to 2D, the symbol "x" stands for the position of the center axis 98A of the valve port 98 and the symbol "•" denotes the position of the gravity center G of the plane defined by the opening region M. In order to more uniformly exhaust the ambient gas in the processing space S from around the mounting table 44, it is preferred that the center axis 44A of the mounting table 44 be positioned on a movement trajectory of the gravity center G of the plane defined by the opening region M.

FIG. 3 illustrates the change in the position of the gravity center G. In this figure, G(5), G(10), G(20) and G(40) indicate the gravity centers in cases where the valve opening degree is 5%, 10%, 20% and 40%, respectively.

In this way, the gravity center G moves rectilinearly as the valve opening degree is changed. Since the practical use region of the valve opening degree is in the range of 5 to 40%, it is preferable to attach the pressure control valve 88 such that the center axis 44A of the mounting table 44 is positioned on a straight line connecting the gravity centers G(5), G(10), G(20) and G(40). Inasmuch as the film-forming and the etching are performed in a valve opening degree range of 10 to 20% during the actual wafer processing, it is more preferable to attach the pressure control valve 88 such that the center axis 44A of the mounting table 44 is positioned on a straight line joining the gravity centers G(10) and G(20).

Referring back to FIG. 1, the vacuum pump 92 of the gas exhaust system 90 may be, e.g., a turbo molecular pump that can generate a high degree of vacuum. The gas is exhausted through a gas exhaust pipe 110 connected to the vacuum pump 92. Although not shown in the drawings, a main vacuum pump operable in a broad band of pressure and a pollution preventing device are arranged on the downstream side of the gas exhaust pipe 110.

The overall operation of the plasma processing apparatus 40 is controlled by a controller 112 including, e.g., a microcomputer. The computer program for performing this operation is stored in a storage medium 114 such as a floppy disk, a compact disc (CD), a hard disk drive (HDD), a flash memory or the like. More specifically, the supply and flow rate control of the respective processing gases, the supply and electric power control of the microwaves and the high-frequency waves, and the control of the process temperature and process pressure are performed according to commands from the controller 112.

Next, description will be made on a processing method performed by the plasma processing apparatus 40 configured as above.

First, the wafer W is loaded into the processing chamber 42 through the gate valve 48 by a transfer arm (not shown). By vertically moving the elevator pins (not shown), the wafer W is mounted on the upper holding surface of the mounting table 44. Then, the wafer W is electrostatically attracted and held in place by the electrostatic chuck 80.

If the mounting table 44 is provided with a heating unit, the wafer W is heated by the heating unit to a specified process temperature. A processing gas as required, e.g., an etching gas in case of performing an etching process or a film-forming gas in case of performing a plasma CVD process, is made to flow at a prescribed flow rate so that the processing gas is supplied into the processing chamber 42 from the gas supply unit 74 including the shower head portion 78. At the same time, the vacuum pump 92 of the gas exhaust system 90 is operated and the interior of the processing chamber 42 is kept at a predetermined process pressure by controlling the pressure control valve 88. Concurrently, the microwave generator 70 of the plasma generating unit 56 is driven to generate microwaves which in turn are fed to the planar antenna member 58 via the waveguide tube 68 and the coaxial waveguide tube 64. The microwaves whose wavelength is shortened by the retardation member 60 are introduced into the processing space S, whereby plasma is generated in the processing space S to perform the etching.

As the microwaves are introduced into the processing chamber 42 from the planar antenna member 58 in this manner, the processing gas is converted into plasma and activated by the microwaves. The surface of the wafer W is subjected to etching or film-forming by means of the active species generated at this time. In the plasma processing process, a RF bias power is applied from the RF bias power supply 86 to the conductor wire of the electrostatic chuck 80, whereby the active species and the like are drawn to the wafer surface with increased rectilinear mobility.

During the plasma processing process, the ambient gas in the processing chamber 42 is vacuum-exhausted by the vacuum pump 92 of the gas exhaust system 90 as set forth above, so that the ambient gas is made to flow down around the mounting table 44 while diffusing in the processing space S. Then, the ambient gas passes through the gas exhaust port 50 and the opening region M (the hatched region in FIGS. 2A to 2D) of the valve port 98 of the pressure control valve 88 and flows toward the vacuum pump 92, e.g., the turbo molecular pump. The pressure in the processing chamber 42 is detected by the pressure detector 108. Based on the detected pressure, the valve control unit 106 operates the actuator 104 to regulate the opening degree of the valve body 96. Thus, the valve control unit 106 performs feed-back control to maintain a desired process pressure.

In this regard, the process pressure is set to fall within various kinds of pressure ranges depending on the kinds of the processes. For instance, the process pressure is set within the range of about 0.5 to 3 Pa in case of the plasma etching but is set within the range of about 5 to 500 Pa in case of the plasma CVD. In any case, the pressure control valve 88 is attached eccentrically from the center axis 44A of the mounting table 44 such that the center axis 44A lies within the practical use region of the valve opening degree, e.g., the opening region M (the hatched region in FIG. 2C) formed according to the valve opening degree of 5 to 40%, and preferably such that the center axis 44A lies on the movement trajectory of the gravity center joining G(10) and G(20) in FIG. 3. Therefore, the area center of the opening region M is generally positioned just below the center portion of the mounting table 44 as can be seen in FIG. 4. As a result, the ambient gas in the processing space S of the processing chamber 42 is substantially uniformly exhausted around the mounting table 44 as indicated by arrows 116 in FIG. 4. This ensures that the ambient gas flows down in a uniformly distributed state around the mounting table 44. Therefore, it is possible to prevent the gas in the processing space S from flowing in a lopsided or unbalanced state, which would occur in the conventional apparatus. This makes it possible to process the wafer W with increased in-plane uniformity.

Now, one example of the actual characteristics of the pressure control valve 88 formed as a gate valve will be described with reference to FIGS. 5A and 5B. FIG. 5A represents the relationship between the valve opening degree and the pressure in the processing chamber and FIG. 5B represents the relationship between the valve opening degree and an exhaust conductance. In the illustrated example, a nitrogen gas is supplied at a flow rate of 25 sccm and a turbo molecular pump (having a capacity of 800 liters/sec and a minimum exhaust conductance of 5.0 liters/sec) is used as the vacuum pump 92.

As represented in FIG. 5A, the change in the pressure in the processing chamber against the change in the valve opening degree is great when the valve opening degree is in the range of 0 to 20%. This means that the pressure can be relatively easily controlled in this range of valve opening degree. The change in the pressure in the processing chamber against the change in the valve opening degree is sharply reduced when the valve opening degree is in the range of 20 to 40%. In particular, if the valve opening degree exceeds 40%, little change occurs in the pressure in the processing chamber, which means that the pressure comes into a saturated state. In this range of valve opening degree, it is almost impossible to control the pressure in the processing chamber. In addition, as can be seen in FIG. 5B, the exhaust conductance is exponentially increased together with the increase in the valve opening degree.

In view of the characteristics represented in FIG. 5A, it can be understood that the practical use region of the valve opening degree of the pressure control valve is in the range of about 5 to 40% and preferably in the range of about to 20%. In this case, the valve opening degree recommended by makers of the pressure control valve is in the range of 5 to 40%.

As described above, with the present invention, the pressure control valve 88 is eccentrically provided to ensure that the center axis 44A of the mounting table 44 lies within the opening region formed over the practical use region of the valve opening degree of the pressure control valve 88. By arranging the pressure control valve 88 in the gas exhaust port 50 eccentrically from the center axis 44A of the mounting table 44, it is possible to exhaust the ambient gas in the processing space S in a uniformly distributed state around the mounting table 44 when the pressure control valve 88 is used in the practical use region of the valve opening degree. This makes it possible to process the wafer W with increased in-plane uniformity.

(Modified Example of the Pressure Control Valve)

Next, description will be made on a modified example of the slide-type pressure control valve.

Figure 6:
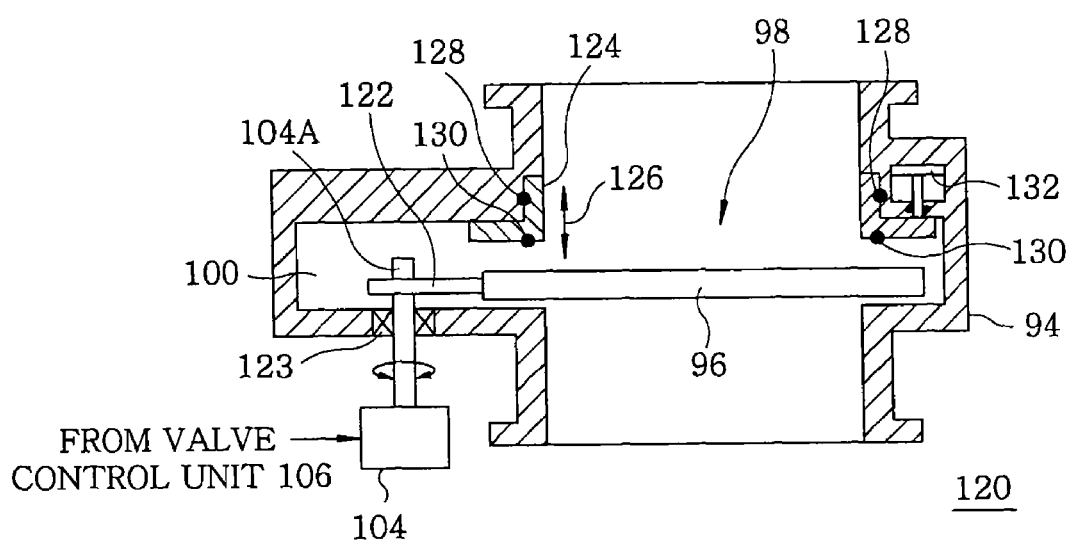
FIG. 6 is a section view showing a modified example of the pressure control valve.
Figure 7A:
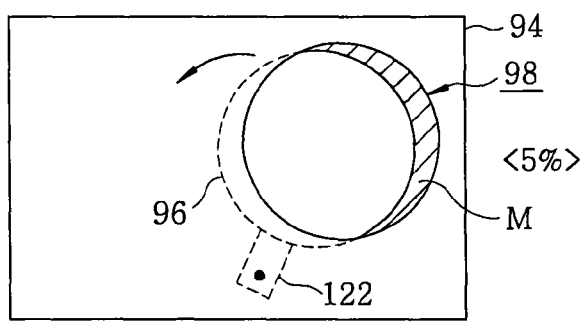
FIGS. 7A to 7C are views explaining the change in a valve opening degree of the pressure control valve shown in FIG. 6.
Figure 7B:
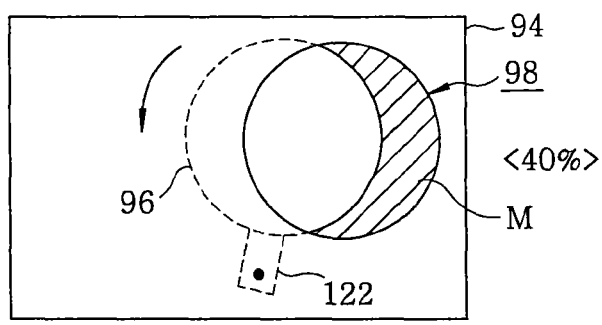
Figure 7C:
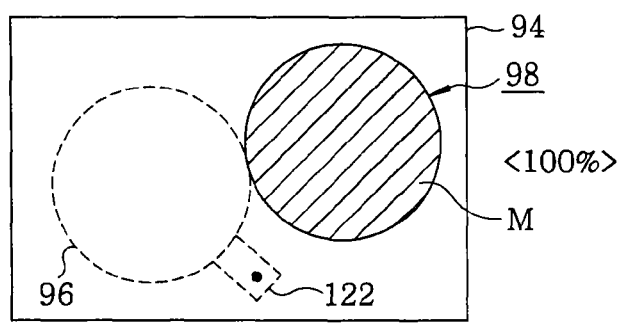
Figure 8:
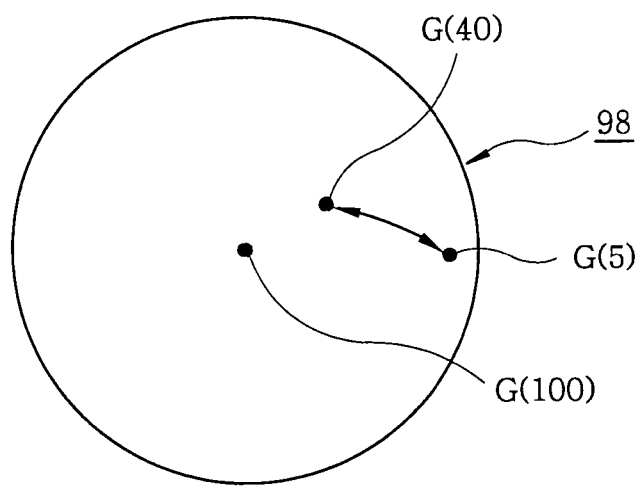
FIG. 8 is a plan view illustrating the movement trajectory of a gravity center of the plane defined by an opening region when a valve opening degree is in the range of 5 to 40%.

FIG. 6 is a section view showing a modified example of the pressure control valve. FIGS. 7A to 7C are views explaining the change in the valve opening degree of the pressure control valve shown in FIG. 6. FIG. 8 is a plan view illustrating the movement trajectory of the gravity center of the plane defined by the opening region when the valve opening degree is in the range of 5 to 40%. The same components as those shown in FIGS. 1 and 2A to 2D will be designated by like reference numerals and redundant descriptions thereof will be omitted.

Although the pressure control valve 88 shown in FIGS. 1 and 2A to 2D includes the rectilinearly sliding type valve body 96, the valve body employed in this modified example is designed to be swingably slid within a so-called horizontal plane along a curvilinear path, e.g., an arc path, like a pendulum. Specifically, as shown in FIGS. 6 and 7A to 7C, the pressure control valve 120 of this modified example includes a valve body 96 arranged within a casing 94. An arm 122 extends from one side of the valve body 96. The arm 122 is fixed at its base end to a rotation shaft 104A of an actuator 104. The actuator 104 is attached to a wall defining a valve body receiving space 100 and includes, e.g., a rotating motor. As the rotation shaft 104A is reciprocatingly swung, the valve body 96 is moved curvilinearly to describe an arc in this example.

A magnetic fluid seal 123 for keeping air-tightness is provided in the portion of the casing 94 through which the rotation shaft 104A passes. On the inner wall surface of the casing 94 defining a valve port 98, there is provided an annular seal ring 124 having an "L"-like cross section. The seal ring 124 is slidable relative to the valve body 96 as indicated by an arrow 126. Seal members 128 and 130 each formed as an O-ring or the like are respectively arranged between the seal ring 124 and the inner wall surface of the casing 94 and on the surface of the seal ring 124 that makes contact with the valve body 96. At one end of the seal ring 124, there is provided a second actuator 132 including, e.g., an air cylinder. The second actuator 132 is operated by the command issuing from the valve control unit 106 (see FIG. 1). When the pressure control valve 120 is fully closed, the second actuator 132 presses the seal ring 124 against the valve body 96 to thereby make the valve opening degree zero. When opening the pressure control valve 120, the seal ring 124 is first moved away from the valve body 96 and then the swinging angle of the valve body 96 is controlled according to the valve opening degree.

FIG. 7A shows the pressure control valve at the valve opening degree of 5%, FIG. 7B showing the pressure control valve at the valve opening degree of 40% and FIG. 7C showing the pressure control valve at the valve opening degree of 100%. Just like the preceding example, the pressure control valve 120 is eccentrically attached such that the center axis 44A of the mounting table 44 lies within the opening region M available at the valve opening degree of 40% (see FIG. 7B)

In this modified example, the movement trajectory of the gravity center of the plane defined by the opening region M is of a curvilinear shape, i.e., a generally arcuate shape. Therefore, as illustrated in FIG. 8, it is more preferable to place the center axis 44A of the mounting table 44 on the movement trajectory formed between the gravity center G(5) available at the valve opening degree of 5% and the gravity center G(40) available at the valve opening degree of 40%.

Figure 9:
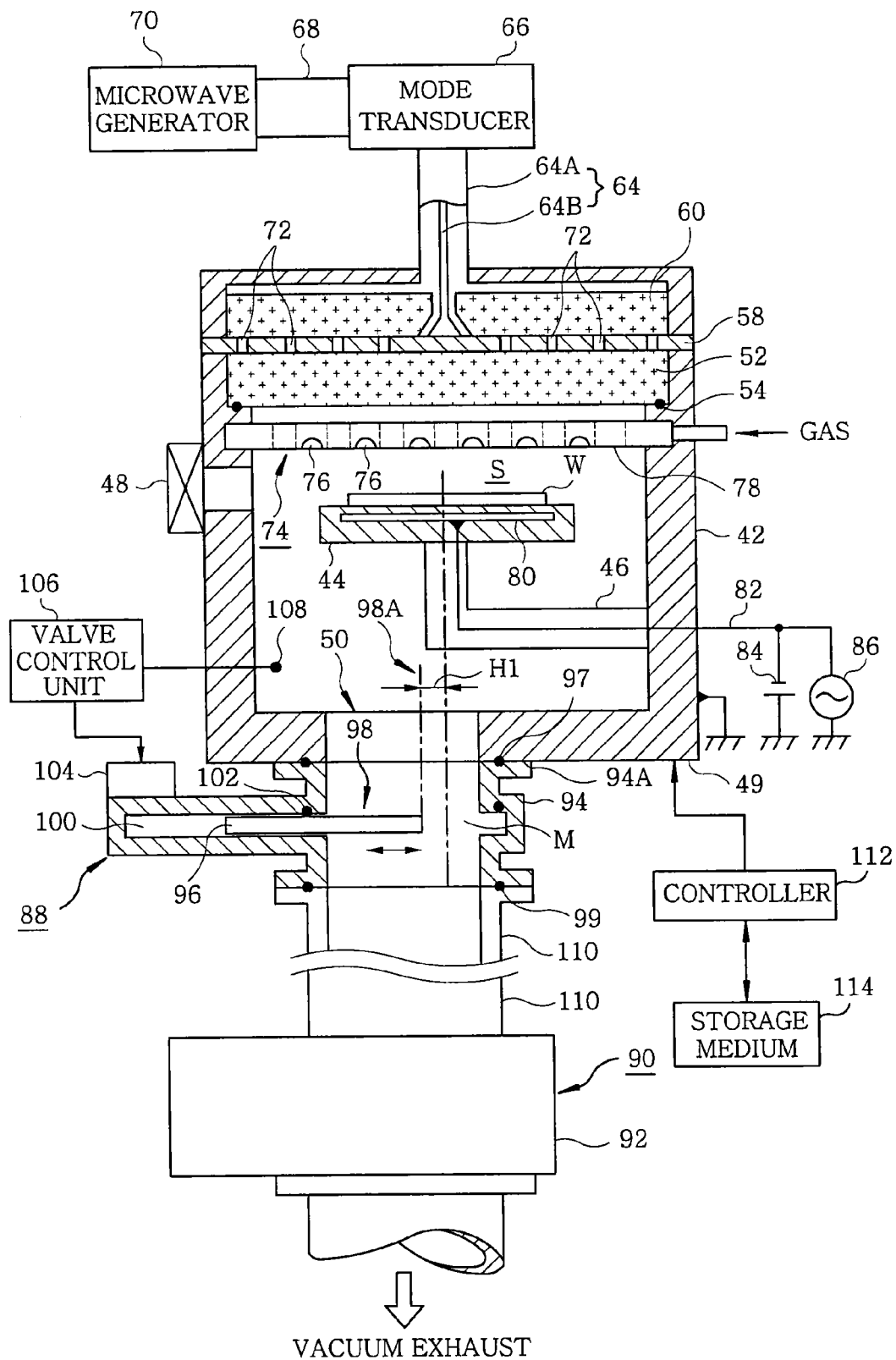
FIG. 9 is a view showing a modified example of an attachment structure of a vacuum pump.

Although the vacuum pump 92 of the gas exhaust system 90 is directly connected to the pressure control valve 88 in the foregoing embodiment, the present invention is not limited thereto. As in a modified example of the attachment structure of the vacuum pump shown in FIG. 9, the gas exhaust pipe 110 of the gas exhaust system 90 may be directly connected to the pressure control valve 88 and the vacuum pump 92 may be provided on the gas exhaust pipe 110.

Figure 10:
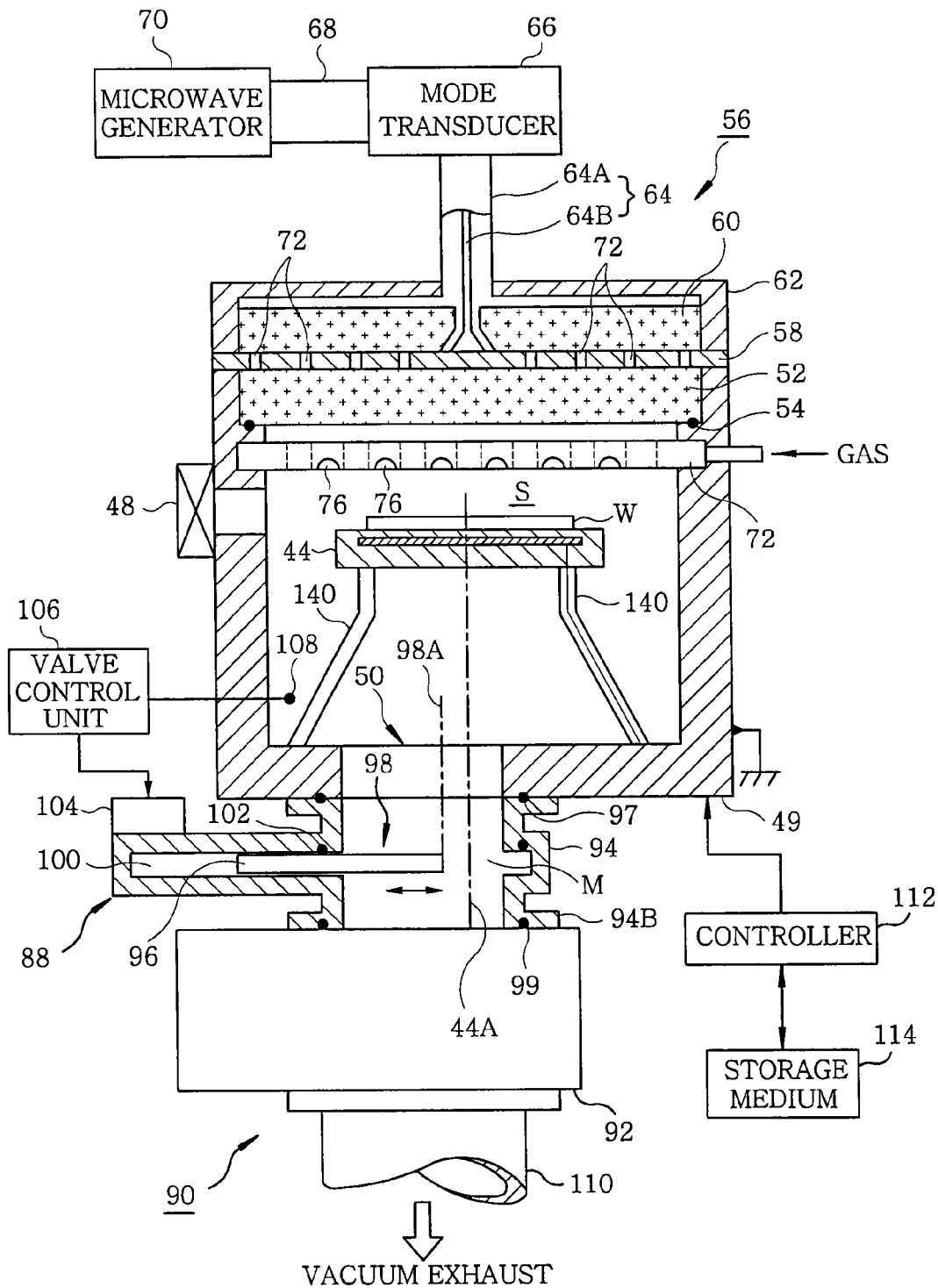
FIG. 10 is a view showing a modified example of an attachment structure of a mounting table.
Figure 11:
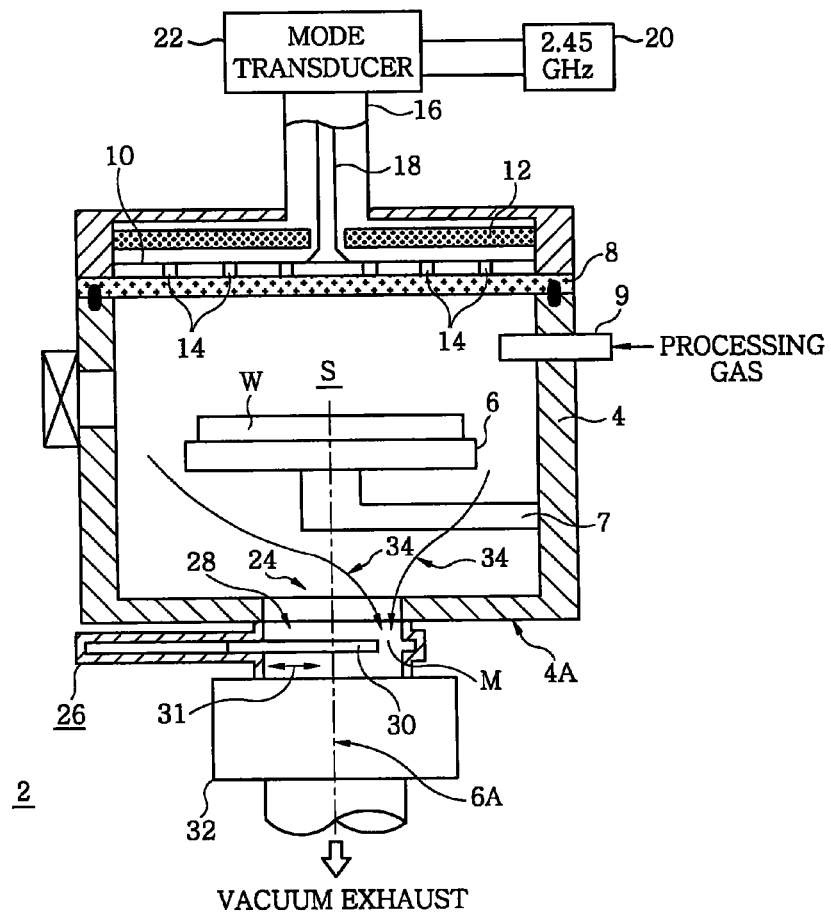
FIG. 11 is a schematic configuration view showing a conventional general processing apparatus.

Furthermore, although the mounting table 44 is supported by the sidewall of the processing chamber 42 through the "L"-like support arm 46 in the foregoing embodiment, the present invention is not limited thereto. As in a modified example of the attachment structure of the mounting table shown in FIG. 10, the mounting table 44 may be supported on the bottom portion 49 of the processing chamber 42 through a plurality of support legs 140 having lower portions gradually expanded.

The size and position of the gas exhaust port 50 formed in the bottom portion 49 of the processing chamber 42 does not matter if the gas exhaust port 50 allows the valve port 98 of the pressure control valve 88 to be fully led to the interior of the processing chamber 42.

Moreover, although the plasma processing apparatus has been described as an example of the single wafer processing apparatus in the foregoing embodiment, the present invention may be applied to all kinds of processing apparatuses for performing various kinds of processes such as film-forming, etching, sputtering, oxidizing and diffusing, reforming and the like regardless of plasma, as long as they are provided with a gas exhaust port in a bottom portion of the chamber.

In addition, although the semiconductor wafer has been described as an example of a target object to be processed in the foregoing embodiment, the present invention is not limited thereto but may be applied to a glass substrate, an LCD substrate, a ceramic substrate and so forth.

What is claimed is:

1. A processing apparatus for performing a specified process on a target object at a predetermined process pressure, the apparatus comprising:
   an evacuable processing chamber having a gas exhaust port formed in a bottom portion thereof;
   a mounting table provided within the processing chamber for holding the target object;
   a pressure control valve connected to the gas exhaust port, the pressure control valve including a slide-type valve body for changing an area of an opening region of a valve port; and
   a gas exhaust system connected to the pressure control valve,
   wherein the pressure control valve is arranged such that a center axis of the mounting table lies within an opening region of the pressure control valve formed over at least part of a practical use region of a valve opening degree of the pressure control valve, and
   the gas exhaust port is formed eccentrically relative to the center axis of the mounting table.

2. The processing apparatus of claim 1, wherein the practical use region of the valve opening degree is in a range of 5 to 40%.

3. The processing apparatus of claim 1, wherein the center axis of the mounting table is positioned along a movement trajectory of a gravity center of gravity of the opening region of the pressure control valve in a plane defined by a plan view of the opening region of the pressure control valve.

4. The processing apparatus of claim 1, wherein the gas exhaust system includes a turbo molecular pump connected to the pressure control valve.

5. The processing apparatus of claim 1, wherein the valve body is rectilinearly slidable.

6. The processing apparatus of claim 1, wherein the valve body is curvilinearly and swingably slidable.

7. The processing apparatus of claim 1, wherein the mounting table is supported by a sidewall of the processing chamber through a support arm or supported on the bottom portion of the processing chamber through support legs.

8. The processing apparatus of claim 7, wherein the mounting table includes an electrostatic chuck connected to a radio frequency (RF) power supply for applying a RF power via a wiring line, and
   wherein the wiring line is provided through the support arm or the support legs.

9. The processing apparatus of claim 1, further comprising a gas supply unit provided above the mounting table for supplying a processing gas within the processing chamber.

10. The processing apparatus of claim 9, wherein the gas supply unit supplies the processing gas through a plurality of gas injection holes.

11. The processing apparatus of claim 10, wherein the gas supply unit includes a shower head portion, and the gas injection holes are formed in the shower head portion.

12. The processing apparatus of claim 1, wherein the mounting table is supported in a plurality of directions.

13. The processing apparatus of claim 1, wherein:
   the gas exhaust port has a center axis which is offset from the center axis of the mounting table; and
   a plan view of the opening region of the pressure control valve includes a center of gravity, and wherein the location of the center of gravity moves along a trajectory as the slide-type valve body moves and the size of the opening region of the pressure control valve changes.

14. The processing apparatus of claim 13, wherein the center axis of the mounting table is located along the trajectory of the center of gravity of the opening region.

15. The processing apparatus of claim 14, wherein the center axis of the mounting table is located along a portion of the trajectory of the center of gravity of the opening region, and wherein said portion of the trajectory corresponds to a path of movement of the center of gravity as the slide-type valve body moves from a 5% valve opening position to a 40% valve opening position.

16. A processing apparatus for performing a specified process on a target object at a predetermined process pressure, the apparatus comprising:
   an evacuable processing chamber having a gas exhaust port formed in a bottom portion thereof;
   a mounting table provided within the processing chamber for holding the target object;
   a gas supply unit provided above the mounting table for supplying a processing gas within the processing chamber;

a ceiling plate provided in the processing chamber for transmitting microwaves;

a plasma generating unit for generating a plasma within the processing chamber, wherein a microwave generator is connected to the plasma generating unit via a waveguide tube, a pressure control valve connected to the gas exhaust port, the pressure control valve including a slide-type valve body for changing an area of an opening region of a valve port; and a gas exhaust system connected to the pressure control valve, wherein the pressure control valve is arranged such that a center axis of the mounting table lies within an opening region of the pressure control valve formed over at least part of a practical use region of a valve opening degree of the pressure control valve, and the gas exhaust port is formed eccentrically relative to the center axis of the mounting table.

17. The processing apparatus of claim 16, wherein the mounting table is supported in a plurality of directions.

18. The processing apparatus of claim 16, wherein:

the gas exhaust port has a center axis which is offset from the center axis of the mounting table; and a plan view of the opening region of the pressure control valve includes a center of gravity, and wherein the location of the center of gravity moves along a trajectory as the slide-type valve body moves and the size of the opening region of the pressure control valve changes.

19. The processing apparatus of claim 18, wherein the center axis of the mounting table is located along the trajectory of the center of gravity of the opening region.

20. The processing apparatus of claim 19, wherein the center axis of the mounting table is located along a portion of the trajectory of the center of gravity of the opening region, and wherein said portion of the trajectory corresponds to a path of movement of the center of gravity as the slide-type valve body moves from a 5% valve opening position to a 40% valve opening position.

* * * * *